United States Patent
Sitzman

(10) Patent No.: US 9,648,727 B2
(45) Date of Patent: May 9, 2017

(54) FAULT DETECTION OPTIMIZED ELECTRONIC CIRCUIT AND METHOD

(71) Applicant: HARRIS CORPORATION, Melbourne, FL (US)

(72) Inventor: Justin Sitzman, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 266 days.

(21) Appl. No.: 14/602,647

(22) Filed: Jan. 22, 2015

(65) Prior Publication Data

US 2016/0219691 A1 Jul. 28, 2016

(51) Int. Cl.
| H05K 1/02 | (2006.01) |
| H05K 3/34 | (2006.01) |
| G01R 31/28 | (2006.01) |
| H05K 1/18 | (2006.01) |
| H01G 4/30 | (2006.01) |
| H01G 4/40 | (2006.01) |
| H01G 13/00 | (2013.01) |

(52) U.S. Cl.
CPC ....... *H05K 1/0268* (2013.01); *G01R 31/2884* (2013.01); *H01G 4/30* (2013.01); *H01G 4/40* (2013.01); *H01G 13/00* (2013.01); *H05K 3/3442* (2013.01); *H05K 2201/10015* (2013.01); *H05K 2203/162* (2013.01); *Y02P 70/613* (2015.11)

(58) Field of Classification Search
CPC .............. H05K 1/0268; H05K 3/3442; H05K 2201/10015; H05K 2203/162; G01R 31/2884; H01G 11/22; Y02P 70/613
USPC .................... 324/750.1–750.3; 361/328, 329
See application file for complete search history.

(56) References Cited

U.S. PATENT DOCUMENTS

| 4,675,790 | A | | 6/1987 | DeMatos et al. |
| 4,827,634 | A | | 5/1989 | Tanabe |
| 5,357,662 | A | * | 10/1994 | Takagi ............. H01L 41/29 29/25.35 |
| 5,448,445 | A | | 9/1995 | Yamate et al. |
| 7,982,139 | B2 | * | 7/2011 | Kariya ............. H05K 1/162 174/260 |
| 2008/0315892 | A1 | * | 12/2008 | Parker ............. G01R 31/2812 324/537 |

FOREIGN PATENT DOCUMENTS

CA 2381117 10/2002

* cited by examiner

*Primary Examiner* — Melissa Koval
*Assistant Examiner* — Rahul Maini
(74) *Attorney, Agent, or Firm* — Fox Rothschild LLP; Robert J. Sacco; Carol E. Thorstad-Forsyth

(57) ABSTRACT

Fault detection optimized electronic circuit includes a circuit substrate on which components of the electronic circuit are respectively disposed. Each of the components has a component body which includes at least a first and second contacts. A component trace formed of conductive material is disposed on a first exterior surface of each component body facing the substrate. The component trace is electrically insulated from the first and second contact. Each of the components contains a network consisting of at least two capacitors connected in series between the first and second contact. A test point is formed of conductive material disposed on a second exterior surface of each body. The test point is electrically isolated from the first and second contacts and electrically connected to at least the component trace.

18 Claims, 9 Drawing Sheets

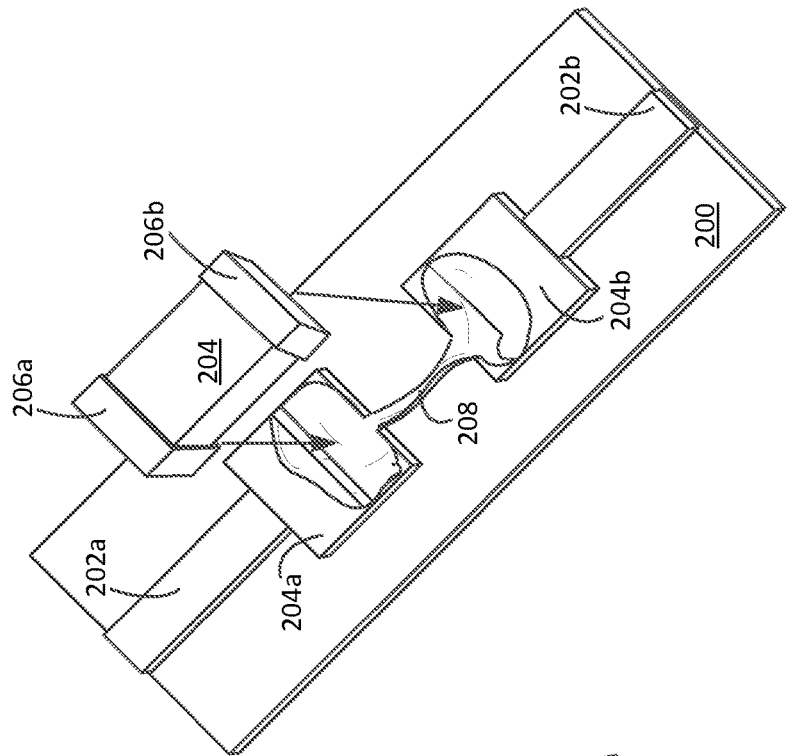
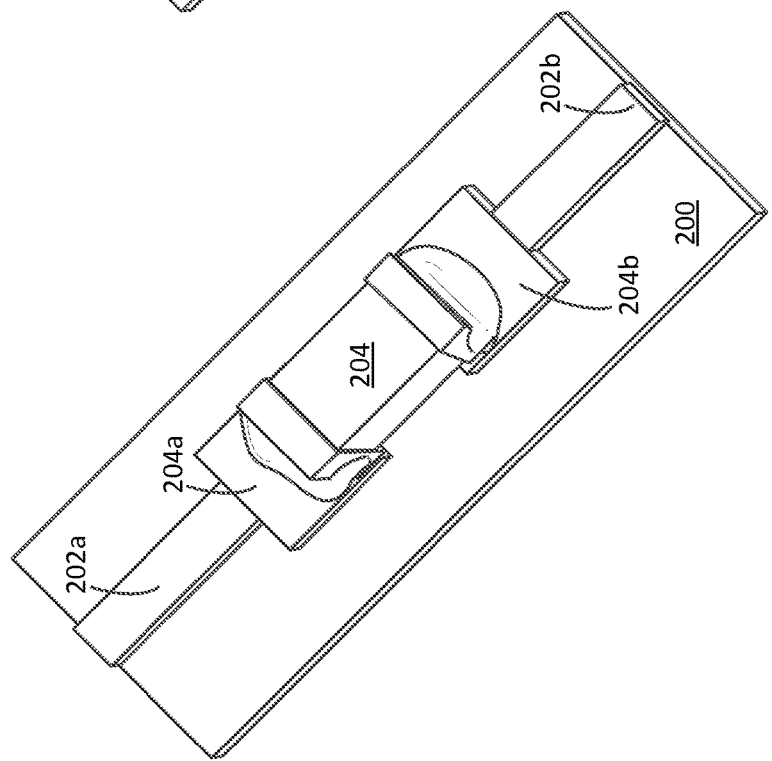
FIG. 2B (Prior Art)
FIG. 2A (Prior Art)

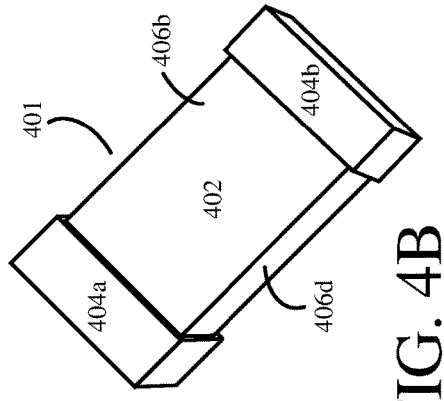
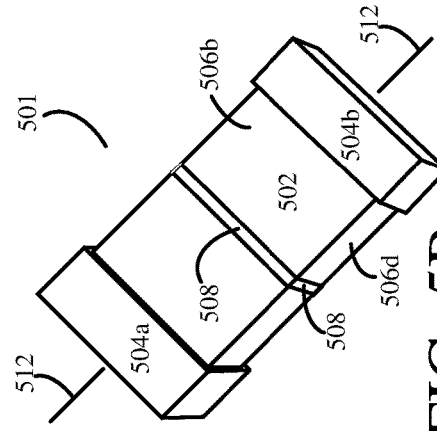
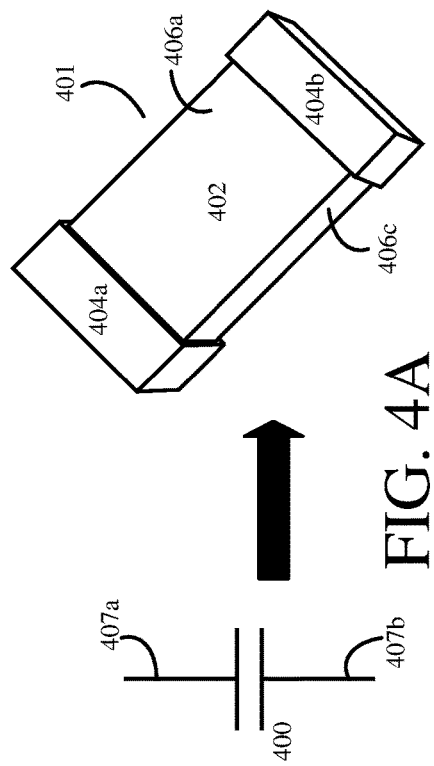
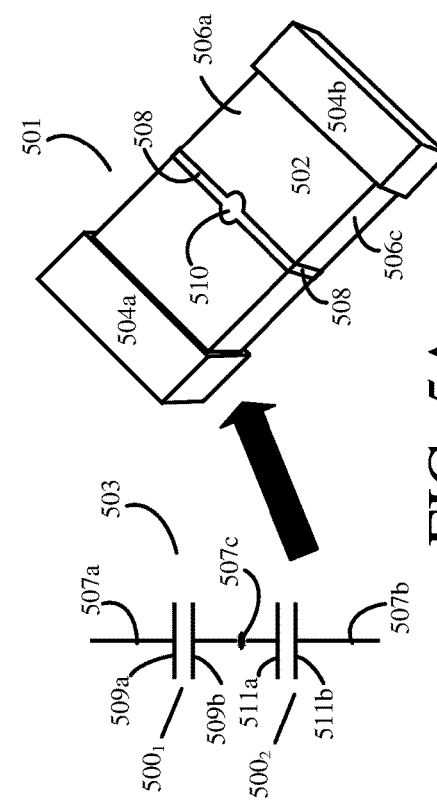
FIG. 4A (Prior Art)
FIG. 4B (Prior Art)
FIG. 5A
FIG. 5B

FAULT DETECTION OPTIMIZED ELECTRONIC CIRCUIT AND METHOD

BACKGROUND OF THE INVENTION

Statement of the Technical Field

The inventive arrangements relate to electronic circuit fault detection and more particularly to methods and systems for fault detection optimization.

Description of the Related Art

Nearly all circuit cards contain a substantial number of capacitors. These capacitors are most often used for decoupling, and are arranged in bulk groups connected between a primary power source and ground. This arrangement leads to a number of problems. For example, most bulk decoupling capacitors in such an arrangement are individually untestable for presence due to the fact that their individual value is a small percentage of the bulk capacitance. Accordingly, the presence or absence of one particular capacitor is difficult to detect.

Also, bulk decoupling capacitors make up a substantial percentage of the total component count of most designs. Thus, they make up a substantial percentage of the total number of likely defect locations. Further, defects associated with decoupling capacitors are among the most difficult and time-consuming to resolve. Common defects can include power-to-ground shorts, and degraded performance. Moreover, polarized capacitors cannot be electrically tested to ensure correct polarization.

Current technologies used to test for individual capacitors include automatic/manual optical test and electrical testing. Optical testing has the advantage of being sometimes able to detect a missing part. However, optical testing does not facilitate testing a component for value, and has at best only a marginal ability to locate either shorted or open pins.

Electrical testing is advantageous because it can detect the presence of a short in a network of capacitors. However, in most cases it does not facilitate detection of individual missing capacitor components. In order to understand why this is so, assume that a bank of twenty 1 uF at 10% tolerance capacitors needs to be tested, where the net capacitance of the entire bank=20 uF, +/−2 uF. Those skilled in the art will appreciate that up to two capacitors can be missing or tomb-stoned and the electrical test will still pass. In such a scenario, 18 of the capacitors can be considered tested, but which of the 18 are tested is not known. In fact, it is impossible to guarantee that any one of the 20 capacitors is actually tested, as any two can be missing.

Electrical testing also cannot detect open circuit pins on most individual capacitor components. The capacitors are high impedance devices and an open circuit measurement is normally expected when measuring between the two plates of a capacitor. Accordingly, open circuit pins are difficult to detect. Finally, electrical testing is not useful when trying to test a capacitor component discretely for shorted pins (i.e., a short circuit which electrically connects the plates of the capacitor). Shorted networks of capacitors can be detected. But, electrical testing does not facilitate identification of which capacitors are shorted because in many cases all of the capacitors in the network are connected in parallel. If one capacitor is shorted, all will appear to be shorted.

Troubleshooting power-to-ground shorts is complicated significantly by the typically large number of capacitors which reside on the affected nets. Current technologies used include optical inspection to locate visible shorts. However, an operator may need to check hundreds of components in order to locate a defect. In some scenarios, x-ray inspection of circuit boards is used to locate shorts underneath components. However, an operator may need to check hundreds of components in order to locate a defect. Other methods include Tone Ohm or micro-ohm meters to narrow likely short locations geographically on the board. However, operator experience is crucial in this method and an unskilled operator will not be able to use this equipment. Thermal imaging can also be used to locate hotspots which occur in the vicinity of a short circuit. Current is injected through the shorted nets, warming up the short while the entire assembly is monitored for thermal deviations. Extremely robust current injection points must be established, frequently necessitating soldering to the unit. Shorts internal to the printed wiring board can be 'blown out', making it impossible to determine where the short 'was'. Reliability concerns typically prevent such a unit from being deliverable. An operator must be specially trained to properly use this method.

SUMMARY OF THE INVENTION

Embodiments of the invention concern a fault detection optimized electronic circuit. The circuit includes a circuit substrate on which are disposed a plurality of circuit traces formed of conductive material and defining a plurality of attachment sites, each including at least a first and second pad. Surface Mount Device (SMD) components of the electronic circuit are respectively disposed at the plurality of attachment sites. Each of the SMD components has a body which includes at least a first and second contact formed of conductive material. At each attachment site, the first contact is electrically connected to the first pad, and the second contact is electrically connected to the second pad. A component trace formed of conductive material is disposed on a first exterior surface of each component body facing the substrate. The component trace is electrically insulated from the first and second contact. Each of the SMD components which are positioned at the plurality of attachment sites respectively contain a network consisting of at least two capacitors connected in series between the first and second contact. A test point is formed of conductive material disposed on a second exterior surface of each body. The test point is electrically isolated from the first and second contacts and electrically connected to at least the component trace. The test point electrically can also be electrically connected to a node of the network where the at least two capacitors are connected in series.

The invention also concerns a method for fault detection in an electronic circuit. The method involves providing a plurality of surface mount device (SMD) components, each including a first and second capacitor connected in series between first and second electrical contacts of the SMD component. On an exterior surface of each of the SMD components there is provided a component trace formed of conductive material and electrically insulated from the first and second electrical contacts. A test point is also provided on the exterior surface of the body and formed of conductive material. For example, the component trace can be formed on an exterior surface of the body opposed from the test point. The test point is electrically connected to the component trace. The method further involves providing a printed wiring board (PWB) substrate with a plurality of circuit traces formed of conductive material disposed on a surface thereof. The circuit traces define a plurality of attachment sites, each including at least first and second conductive pads. The electronic circuit is formed by positioning one of the SMD components at each of the plurality of attachment sites. Soldering operations are performed at each attachment site to electrically connect at least the first and second electrical contacts to the first and second conductive pads. The method further involves testing the electronic circuit to determine at least one fault by measuring an impedance or a resistance as between the test point and at least one of the first and second electrical contacts.

The invention also includes a surface mount device (SMD) component. The SMD component includes a device body which includes at least a first and second contact formed of conductive material disposed on opposing ends thereof. The first contact is electrically connected to a first conductive plate of a first capacitor disposed within the device body, and the second contact is electrically connected to a first conductive plate of a second capacitor disposed within the device body. An electrical connection within the device body is provided between the second conductive plate of the first capacitor and the second conductive plate of the second capacitor to define a network node. A component trace is formed of conductive material disposed on a first exterior surface of the device body which is intended to face a circuit substrate on which the SMD component will be mounted. The component trace is electrically insulated from the first and second contact. Further, a test point is disposed on a second exterior surface of the device body opposed from the first exterior surface, the test point is electrically connected to at least one of the network node and the component trace.

BRIEF DESCRIPTION OF THE DRAWINGS

Embodiments will be described with reference to the following drawing figures, in which like numerals represent like items throughout the figures, and in which:

FIGS. 2A, 2B and 2C are drawings which are useful for understanding certain types of circuit faults which can occur in a printed wiring board context.

FIG. 4A is a top perspective view of a convention circuit component

FIG. 4B is a bottom perspective view of the circuit component in FIG. 4A.

FIG. 5A is a top perspective view of a circuit component that is useful for improved fault detection in electronic circuits.

FIG. 5B is a bottom perspective view of the circuit component in FIG. 5A.

DETAILED DESCRIPTION

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

Figure 1:
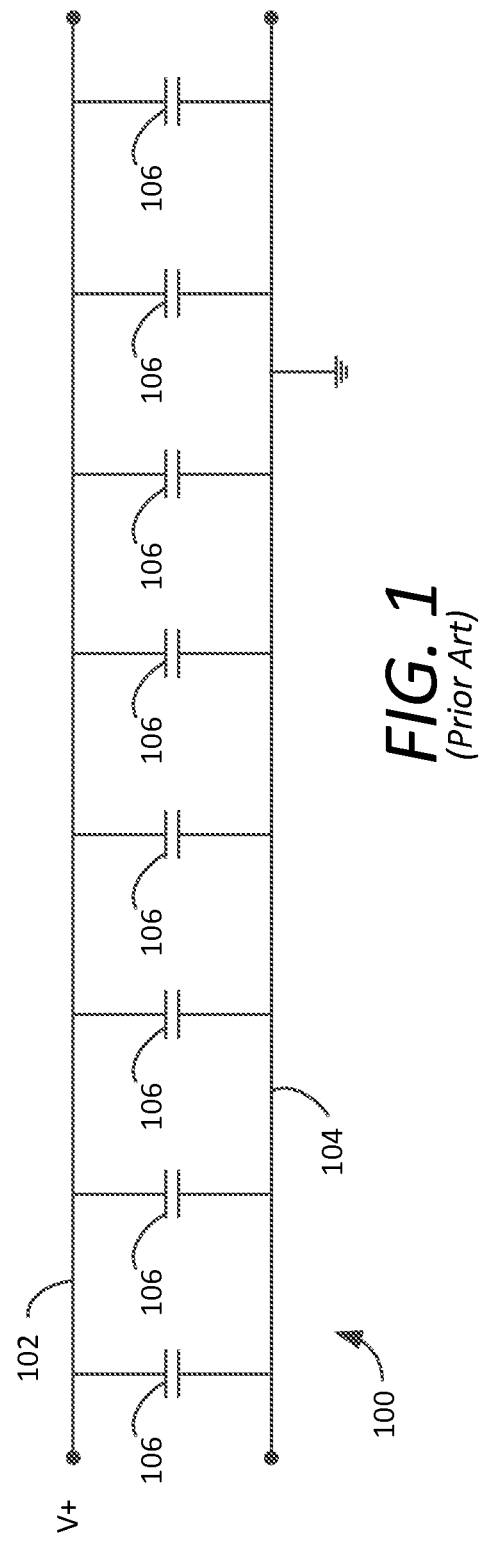
FIG. 1 is a schematic diagram which shows a plurality of decoupling capacitors connected between a primary power source and ground.

Referring now to FIG. 1 there is shown an exemplary bank of capacitors 100 which can be used for decoupling. As is shown, the capacitors 106 are arranged in bulk groups connected between a primary power source 102 and ground 104. This arrangement leads to a number of problems. For example, most bulk decoupling capacitors in such an arrangement are individually untestable for presence due to the fact that their individual value is a small percentage of the bulk capacitance. Accordingly, the presence or absence of one particular capacitor is difficult to detect.

Figure 2C:
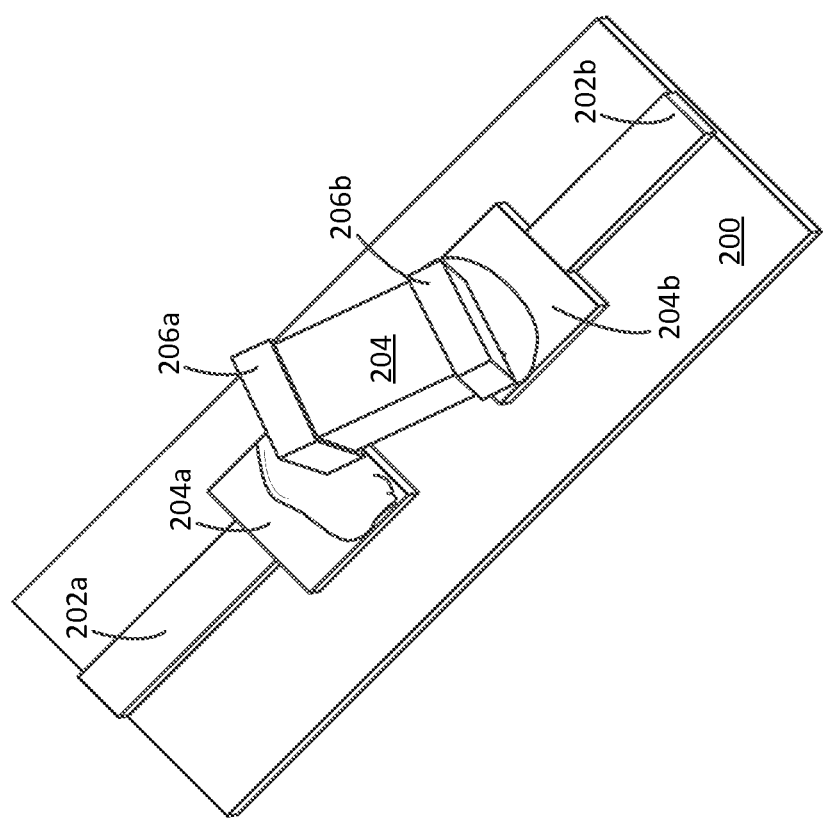

Optical testing is often problematic because defects can be hidden. As shown in FIG. 2A, a capacitor in the form of a surface mount device (SMD) 204 can be soldered to conductive pads 204a, 204b which are connected to circuit traces 202a, 202b. The conductive pads and circuit traces are disposed on a circuit board 200. The assembly appears to be normal and free of faults. However, in the exploded view shown in FIG. 2B, it can be observed that a solder bridge 208 has formed underneath the SMD 204, thereby causing a short circuit between conductive pads 204a, 204b. In a scenario where SMD 204 is part of a bank of capacitors in connected parallel, the entire bank of capacitors would be shorted due to the solder bridge. However, optical testing would not reveal the fault because it is hidden beneath the SMD and electrical testing would fail to identify which of the many capacitors comprising the capacitor bank actually included the solder bridge 208. FIG. 2C shows a scenario in which capacitor 204 has been incorrectly soldered to circuit board 200. Optical testing might reveal the problem to an observant technician/tester, but electrical testing would not show any defect. An electrical measurement across contacts 206a, 206b would show an open circuit, as expected, even though the SMD was not fully connected to the circuit.

Figure 3:
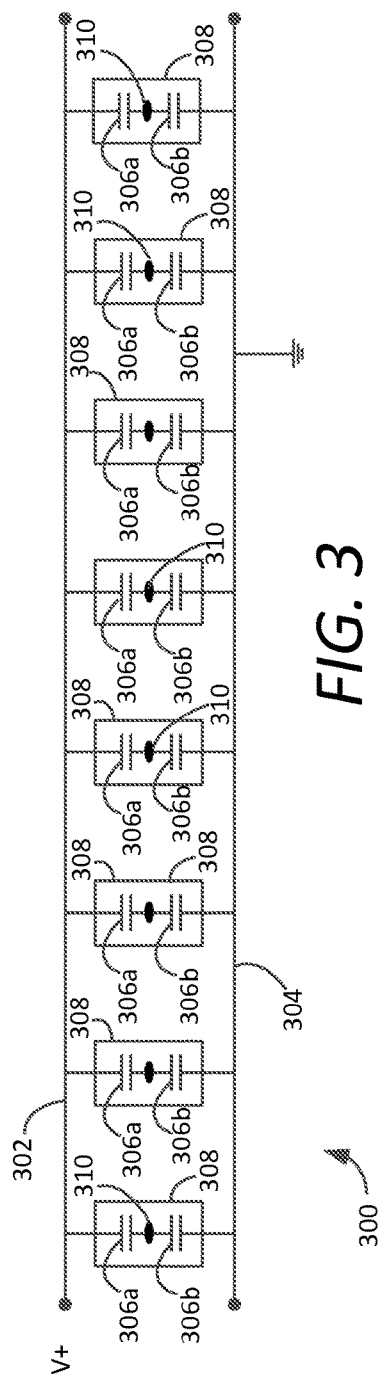
FIG. 3 is a schematic diagram that is useful for understanding an optimized circuit for detecting circuit faults.

Referring now to FIG. 3, there is shown a schematic diagram that is useful for understanding a method and system for optimized testing of electronic circuits. The circuit shown is a bank of capacitors 300 which may be used for any purpose, such as decoupling. As is known, decoupling capacitors are commonly arranged in groups connected between a primary power source 302 and ground 304 to bypass high-frequency signals and noise. The decoupling capacitors 306a, 306b are arranged in series pairs to define a network, and the network is connected between the primary power source and ground. In an embodiment of the invention, each of the series pairs 306a, 306b is electrically connected at a node 310. As explained in further detail below, node 310 is electrically connected to a test point (not shown in FIG. 3) external of an SMD body 308 for test purposes. Node 310 can also be connected to a component trace (not shown in FIG. 3) residing on an exterior surface of the SMD body. The arrangement shown in FIG. 3 facilitates sets of stacked capacitors 306a, 306b in a single, three-pin SMD body to facilitate testing and troubleshooting the capacitor bank as hereinafter described.

Referring now to FIGS. 4A and 4B it can be observed that a conventional SMD 401 comprising a capacitor (sometimes referred to as a chip capacitor) includes a body 402 which generally has the shape of a cuboid or rectangular prism. An SMD 401 as referenced herein is an electronic device that is used in producing electronic circuits which are manufactured using surface-mount technology (SMT) rather than through-hole technology construction (in which wire leads of components are inserted and soldered in holes formed in the circuit board). SMD components are commonly manufactured as small rectangular chips as shown. The body 402 includes a top surface 406a, a bottom surface 406b, and sides 406c, 406d. Internally, the conventional SMD 401 defines a single capacitor which can be schematically represented as capacitor 400. The SMD 401 is internally arranged so that the two opposing terminals 407a, 407b of capacitor 400 correspond (i.e., are electrically connected) to contacts 404a, 404b.

In contrast to the conventional SMD capacitor 401, there is shown in FIG. 5A-5B an SMD component 501 which is useful for understanding the inventive arrangements. The SMD component 501 includes a body 502 which is similar in appearance and size to a conventional SMD 401. As such, the body 502 generally has the shape of a cuboid or rectangular prism. The actual size of SMD component 501 as disclosed herein can vary depending on the particular application. However, it is anticipated that the body size may range from as large as 19 mm×19.0 mm×4.3 mm to as small as 2.0 mm×1.3 mm×1.2 mm, without limitation. Still, the invention is not limited in this regard and other body sizes are also possible.

The body 502 includes a top surface 506a, a bottom surface 506b, and sides 506c, 506d. Electrical contacts 504a, 504b are disposed on opposing ends of the body. The electrical contacts are formed of a conductive material, such as copper and can be coated or tinned with a thin outer layer of solder. Internally, the SMD component 501 comprises a network 503 which includes a plurality of capacitors. The network can be schematically represented as shown in FIG. 5A wherein capacitor $500_1$, $500_2$ are electrically connected in series at a node 507c. The two capacitors $500_1$, $500_2$ are arranged internal of the SMD component so that the two opposing terminals 507a, 507b of capacitor $500_1$, $500_2$ correspond to contacts 504a, 504b disposed on body 502. In other words, the two opposing terminals 507a, 507b are respectively electrically connected to contacts 504a, 504b. Each capacitor $500_1$, $500_2$ is comprised of first and second capacitor plates which are respectively identified in FIG. 5A as 509a, 509b and 511a, 511b.

SMD component 501 also includes a component trace 508. The component trace 508 is formed of a conductive material, such as copper and can be coated or tinned with a thin outer layer of solder. The component trace extends across at least a portion of an exterior surface of body 502. According to one aspect, the component trace extends in a direction which is generally transverse to an SMD axis 512 extending from contact 504a to contact 504b. The component trace is advantageously disposed at least on the bottom surface 506b of the body which faces toward a circuit board substrate when the SMD component is mounted to a circuit board. In some embodiments, the component trace can also extend around one or both sides 506c, 506d as shown. Still, the invention is not limited in this regard and the component trace can be disposed on other portions of the body.

A test point 510 is provided on the top surface 506a of the SMD component 501. The test point 510 can be formed of the same material as the component trace and is electrically connected to node 507c. The test point is also advantageously electrically connected to component trace 508. According to one aspect of the invention, the component trace 508 can extend from one or both sides 506c, 506d and across the top surface 506a as shown to form an electrical connection with the test point. However, the invention is not limited in this regard and the connection between node 507c, component trace 508 and the test point 510 can instead be provided internally of the SMD component. As an aid to understanding, the arrangement of the capacitors $500_1$, $500_2$ within SMD capacitor 501, the capacitors are shown overlaid on the body of the SMD component in FIG. 6.

Figure 6:
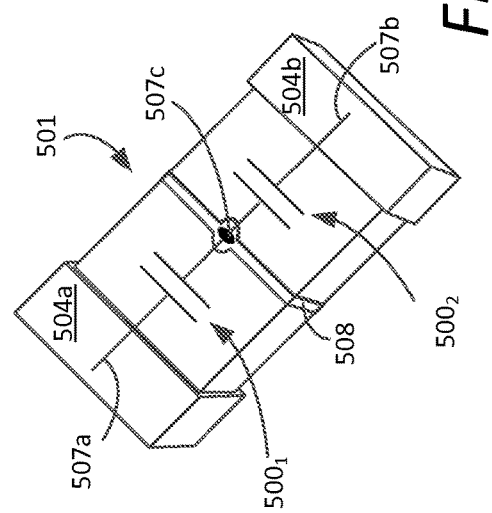
FIG. 6 is a top perspective view of the circuit component in FIG. 5A with a schematic overlay of certain internal circuit components.
Figures 7A, 7B:
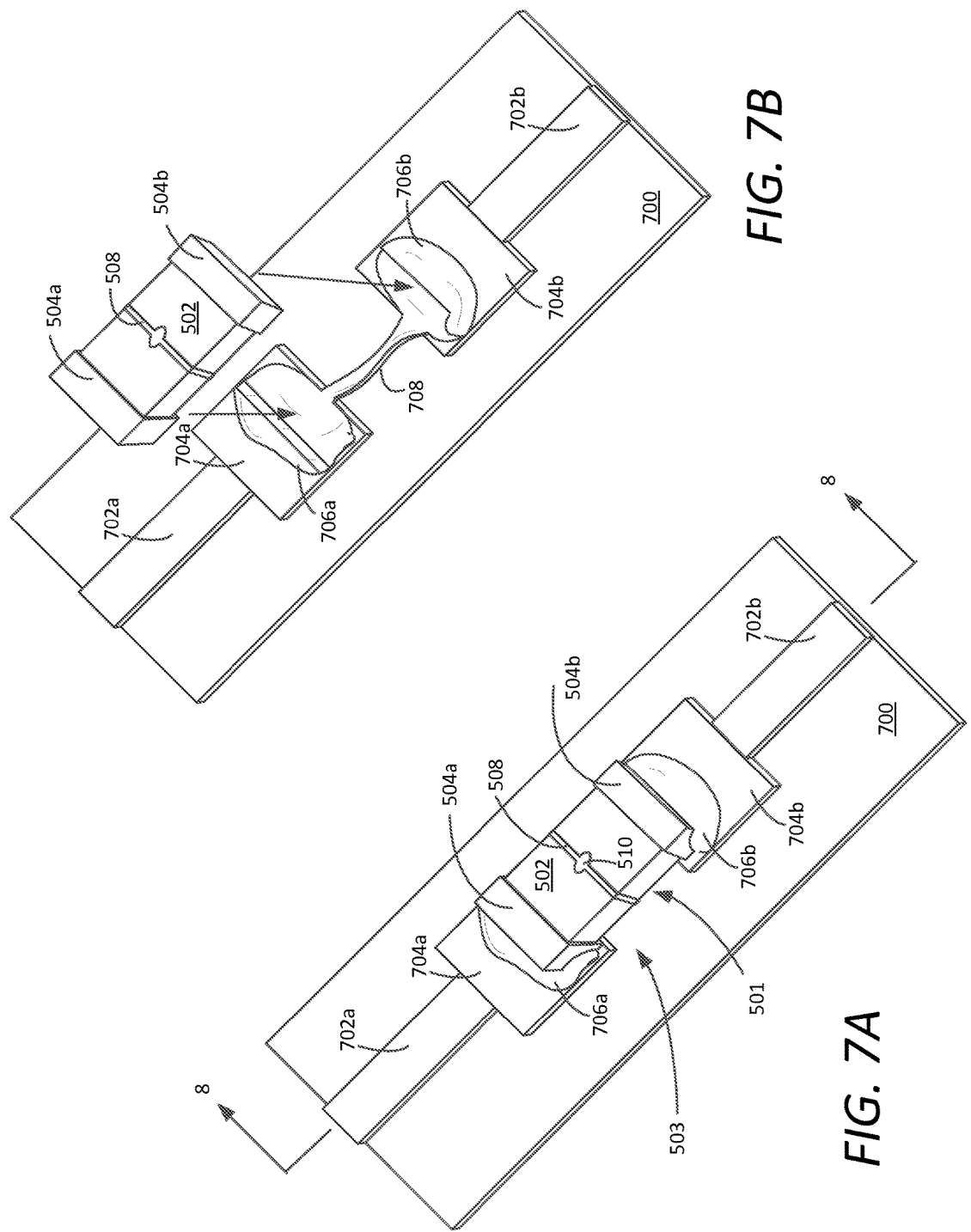
FIG. 7A is a perspective view of the circuit component in FIG. 5A installed on a circuit substrate.
FIG. 7B is an exploded view of FIG. 7A which is useful for showing a circuit fault which can occur in a manufacturing process involving a printed wiring board.

The utility of the SMD component 501 described in FIGS. 5A-5B and 6 will now be explained in further detail in relation to FIGS. 7A-7C. FIG. 7A shows SMD component 501 installed at an attachment site 503 of a printed wiring board (PWB) substrate 700. The SMD component is attached to the PWB in a conventional manner. As such, contacts 504a, 504b are attached to conductive pads 704a, 704b using solder 706a, 706b. The conductive pads are respectively connected to conductive traces 702a, 702b, which are connected to other components or conductive traces on the PWB. For example, in the case where SMD component 501 is being used for decoupling it may be part of a capacitor bank comprised of a plurality of similar SMD components. In such a scenario, conductive traces 702a, 702b may respectively be connected to (or designed for connection to) a primary voltage source and circuit ground. A plurality of such SMD components (not shown) may be connected at other locations in the circuit between the same primary voltage source and circuit ground for decoupling purposes.

In some instances, due to a manufacturing defect, a solder bridge 708 may form between the two conductive pads 704a, 704b as shown in FIG. 7B. The occurrence of such a manufacturing defect within a capacitor bank comprising a plurality of capacitors connected in parallel can be detected using conventional testing means. However, with conventional SMD capacitor components it can be very difficult to isolate the particular SMD capacitor where the defect occurred. This is due to the fact that all of the capacitors in the capacitor bank are connected in parallel. Consequently, a short circuit (e.g., solder bridge 708) across one such capacitor in fact will function as a short circuit across all such capacitors in the capacitor bank.

Figure 8:
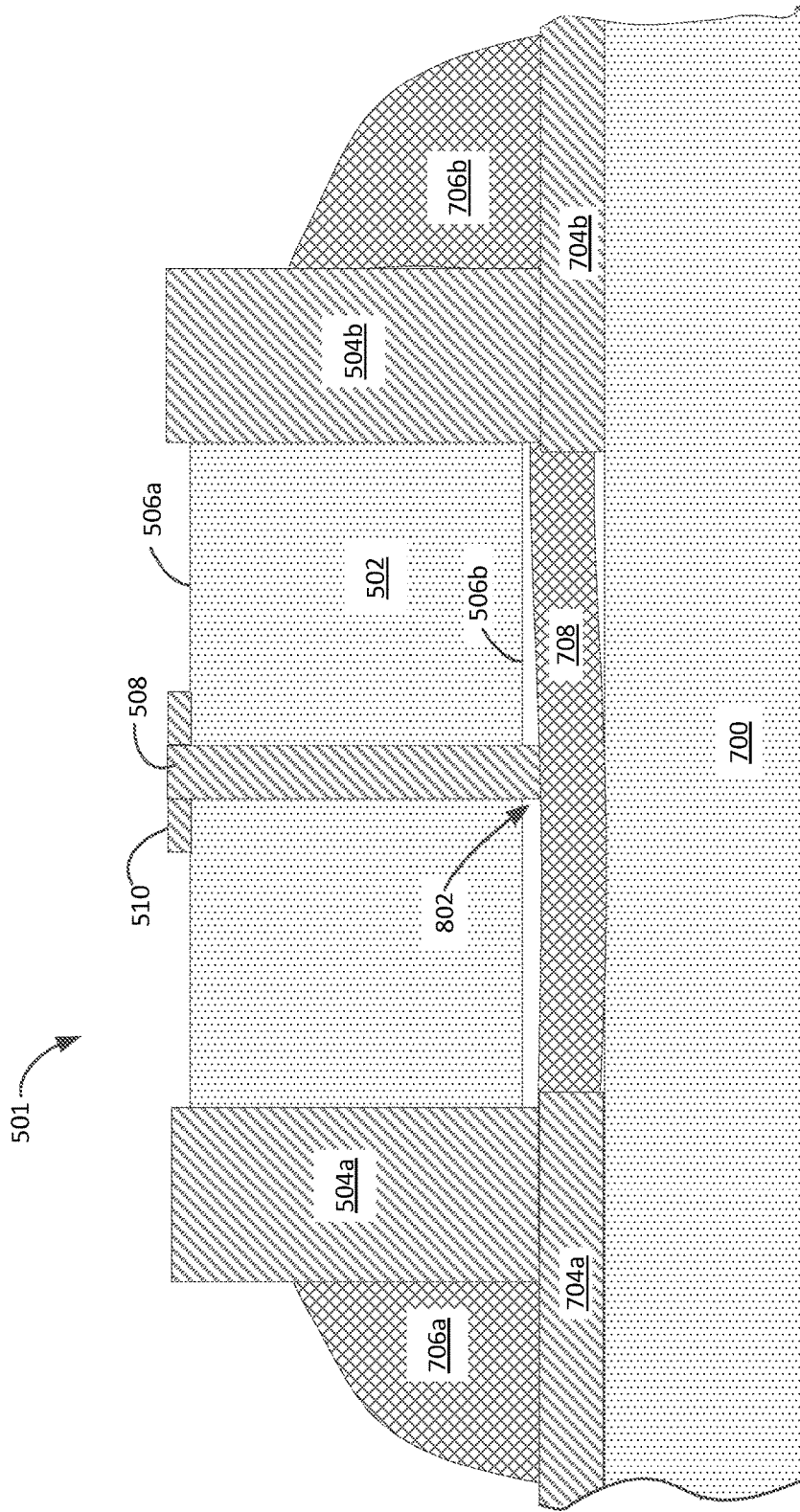
FIG. 8 is a cross-sectional view of the printed wiring board in FIG. 7A, taken along line 8-8.

The arrangement of SMD component 501 solves the foregoing problem as shown in FIG. 8. The presence of component trace 508 disposed on the bottom surface 506b of the body provides a mechanism by which the presence of solder bridge 708 can be detected. In particular, an electrical connection 802 will be formed where component trace 508 intersects or abuts solder bridge 708. To facilitate testing, the component trace 508 is electrically connected to test point 510 as shown. Likewise, node 507c of the capacitor network 503 is also electrically connected to the test point. Accordingly, if an electrical test shows continuity (zero, or nearly zero resistance) between contact 504a or 504b and circuit trace 508, then that fact can be taken as an indication that a fault exists at SMD 501. In a scenario where the test point 510 is electrically connected to the component trace and the network node 507c, the fault can be a solder bridge 708 as shown in FIG. 7B or can be a defect with one of the capacitors $500_1$, $500_2$. In either case, the fault will have been isolated to that particular SMD 501 where continuity is detected between one of the contacts 504a, 504b and test point 510. Moreover, the capacitance of each capacitor $500_1$, $500_2$ can be separately tested in the circuit if necessary by measuring capacitance between one contact 504a, 504b and the test point 510. This may be accomplished by a number of test methodologies, using a variety of test hardware platforms, including in-circuit and flying probe test platforms.

In some embodiments, component trace 508 can be omitted and only node 507c is connected to the test point 510 to facilitate identification of capacitors which are internally shorted. Alternatively, the connection between the test point 510 and node 507c can be omitted and only the connection to component trace 508 may be provided. However, it is advantageous to provide an electrical connection from test point 510 to both component trace 508 and node 507c so that both solder bridge defects and internal component failures can be detected and isolated.

Figure 9:
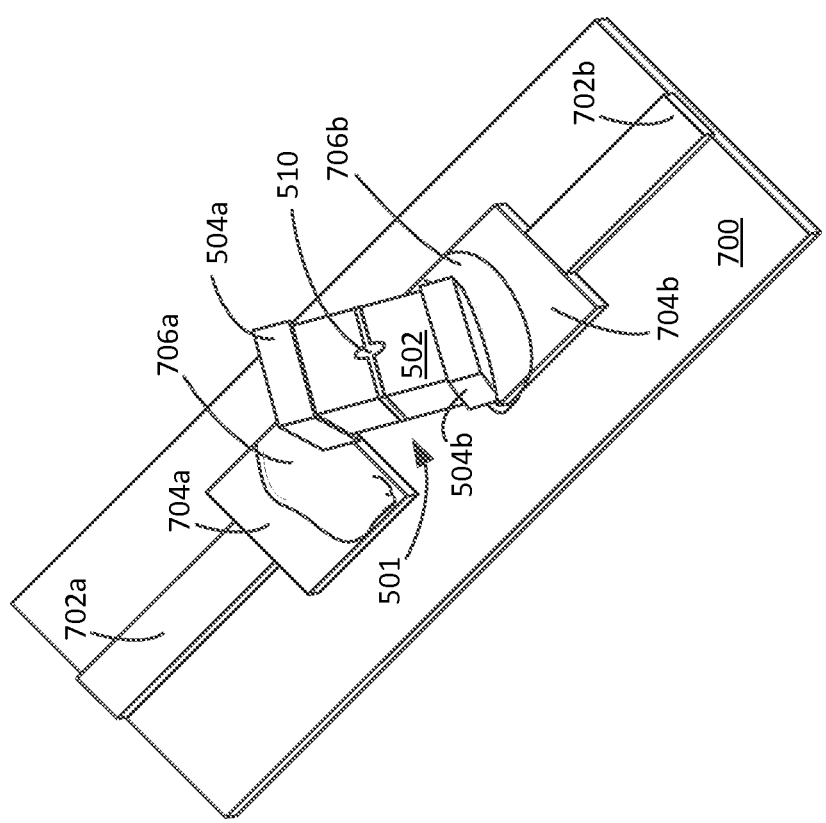
FIG. 9 is a perspective view showing the circuit component in FIG. 5A improperly installed on a circuit board in a way that will produce a circuit fault.

The arrangement of SMD 501 is also useful for detecting faults in other scenarios. For example, in FIG. 9 shows a scenario in which terminals 504a of SMD component 501 has been upwardly displaced such that it is not forming an electrical contact with pad 704a. Conventional electrical testing would not reveal this fault because a measurement across pads 704a, 704b (or contacts 504a, 504b) in FIG. 9 would show an open circuit, which would also be expected in the absence of the fault. Likewise, as explained above, a bulk test of the entire capacitor bank would be unlikely to reveal the fault because the absence of one capacitor from the circuit as shown. In many scenarios the bulk capacitance measurement of a capacitor bank would still be within the tolerance range. However, with the SMD 501 as described herein, a capacitance measurement made between conductive pad 704a and test point 510 would reveal a fault because the capacitance value measured would be incorrect. Moreover, capacitance of each capacitor $500_1$, $500_2$ can be separately measured by testing between test point 510 and each contact 504a, 504b.

The arrangement of SMD 501 also has other benefits. For example, stacking two capacitors as shown mitigates single-point-failure concerns. Both capacitors must fail shorted in order to short out the primary voltage supply. By enabling discrete component testing, functional failures due to missing decoupling capacitors are mitigated because previously untestable components are testable. Further, with an SMD 501 as described, stacked tantalum capacitors can be tested to ensure correct polarity. Effective packaging will enable use of existing SMD footprints.

The electrical connection between the test point 510, component trace 508 and the embedded node 507c, makes it possible to test for a wide variety of potential faults including open pins, shorted capacitor networks, and device value. If the component trace and test point were not electrically connected to the node 507c, it would still be possible to test for shorted capacitor networks using the techniques and methods described herein. This feature alone is considered to be advantageous when compared to existing technologies. However, such an arrangement is of somewhat lesser benefit as it would not facilitate testing for open circuits and device value.

Figure 10:
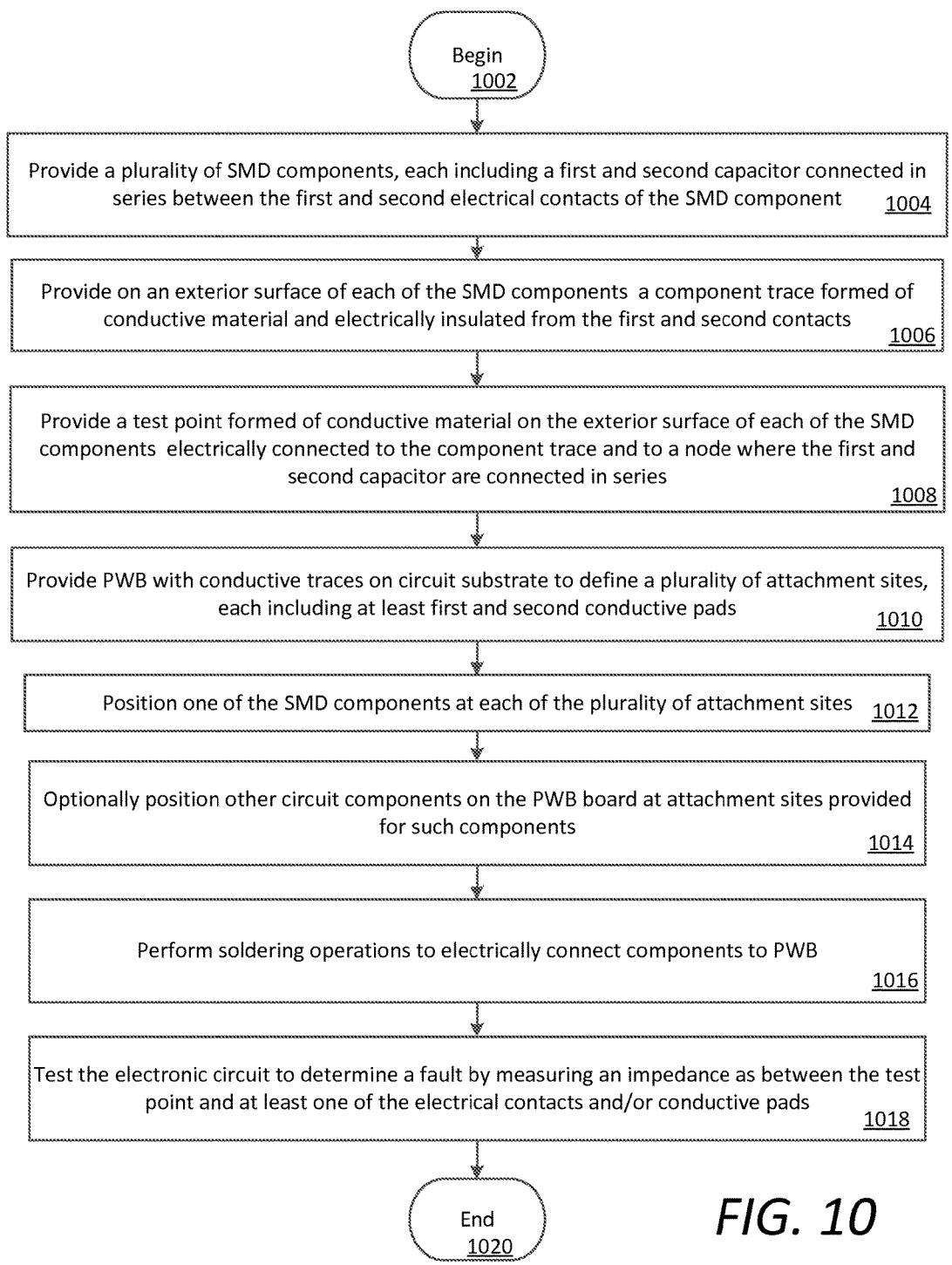
FIG. 10 is a flowchart that is useful for understanding a method for optimized fault detection.

Referring now to FIG. 10 there is shown a flowchart that is useful for understanding a method according to facilitate circuit testing. The method begins at step 1002 and continues to step 1004, which involves providing a plurality of SMD components 501 as described herein, each including a first and second capacitor ($500_1$, $500_2$) connected in series between the first and second electrical contacts (504a, 504b) of the SMD component. The method continues to 1006 where there is provided on an exterior surface of each of the SMD components a component trace (e.g. component trace 508) formed of conductive material and electrically insulated from the first and second contacts. At 1008, the process continues by providing a test point formed of conductive material on the exterior surface of each SMD capacitor component. To facilitate testing, the test point can be advantageously disposed on a surface opposed from the surface which is intended to face the PWB substrate on which the component will be mounted. The test point is electrically connected to the component trace and to a node where the first and second capacitors are connected in series.

At 1010, a PWB is provided which includes a plurality of conductive traces (e.g. conductive traces 702a, 702b) formed on the PWB substrate (e.g. PWB substrate 700). The conductive traces can be formed using conventional techniques for manufacturing PWBs. The conductive traces will define a plurality of attachment sites (e.g. attachment site 503) each including at least first and second conductive pads (e.g., conductive pads 704a, 704b) to which one of the SMD components can be mounted. At 1012, the SMD components are respectively positioned at each of the plurality of attachment sites. Thereafter, at 1014, other circuit components are optionally positioned at other attachment sites provided for such components on the PWB.

At 1016, soldering operations are performed to solder each component to the PWB at its respective attachment site. These soldering operations will involve the SMD components (i.e., SMD components 501) to electrically connect the first and second contacts respectively to the first and second conductive pads, but can also include other types of electronic components that need to be soldered to the board.

Thereafter at 1018, the electronic circuit is tested to determine the presence of one or more faults. The testing process involves measuring a resistance and/or impedance as between the test point and at least one of the electrical contacts of the SMD. Such testing can also involve measuring a resistance/impedance as between the test point and one or both conductive pads. For example, a resistance can be measured as between the test point and one or both of the SMD contacts to identify the presence of potential short circuit paths between the test point and the electrical contacts of the SMD. The impedance measurement can also involve measuring a capacitance as between the test point and one or both SMD contacts. The impedance measurement can further involve measuring a capacitance as between the test point and one or both conductive pads. Other testing methods utilizing the test point are also possible without limitation. The testing described herein can be performed manually or by using computer controlled automated test equipment as is commonly known in the art. A flying probe test fixture is preferably used for this purpose to directly form electrical connections with the test points formed on the SMD components and various other points on the PWB. As is known, flying probe testing uses electro-mechanically controlled probes to access electrical test points on a PWB.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

I claim:

1. A fault detection optimized electronic circuit, comprising:
    a circuit substrate on which are disposed a plurality of circuit traces formed of conductive material and defining a plurality of attachment sites, each attachment site including at least a first and second pad formed of conductive material and respectively connected to one of the circuit traces;
    a plurality of components of the electronic circuit which are respectively disposed at the plurality of attachment sites, each said component comprising a surface mount device (SMD) having a body which includes at least a first and second contact formed of a conductive material disposed on at least a first exterior surface of the SMD's body facing the substrate, wherein said first contact is electrically connected to the first pad, and the second contact is electrically connected to the second pad;
    a component trace formed of a conductive material disposed on the first exterior surface so as to be spaced apart from and electrically insulated from the first and second contacts;
    each of the plurality of components respectively containing a network consisting of at least two capacitors connected in series between the first and second contacts, each capacitor of the at least two capacitors comprising two parallel capacitive plates disposed internal to the SMD's body, a first one of the two parallel capacitive plates connected to a terminal of the network and a second one of the two parallel capacitive plates directly electrically connected to a capacitive plate of the other capacitor of the at least two capacitors at an intermediary node; and
    a test point formed of a conductive material disposed on a second exterior surface of the SMD's body, the test point electrically isolated from the first and second contacts and electrically connected to the component trace and the intermediary node.

2. The fault detection optimized electronic circuit according to claim 1, wherein the second exterior surface is opposed from the first exterior surface.

3. The fault detection optimized electronic circuit according to claim 1, wherein the first pad at each attachment site is connected to one of the circuit traces that comprises a primary power bus for said electronic circuit, and the second pad is connected to one of the circuit traces that comprises a ground conductor.

4. The fault detection optimized electronic circuit according to claim 1, wherein the circuit substrate includes a second plurality of attachment sites at which are respectively disposed a second plurality of components, including electronic components other than capacitors.

5. The fault detection optimized electronic circuit according to claim 1, wherein the component trace extends across the body of the component.

6. The fault detection optimized electronic circuit according to claim 5, wherein the component trace extends in a direction which is transverse to an axial direction of the component which extends between the first and second contacts.

7. A fault detection optimized electronic circuit, comprising:
    a circuit substrate on which are disposed a plurality of circuit traces formed of conductive material and defining a plurality of attachment sites, each attachment site including at least a first and second pad formed of conductive material and respectively connected to one of the circuit traces;
    a plurality of components of the electronic circuit which are respectively disposed at the plurality of attachment sites, each said component comprising a surface mount device (SMD) having a body which includes at least a first and second contact formed of conductive material, wherein said first contact is electrically connected to the first pad, and the second contact is electrically connected to the second pad;
    a component trace formed of conductive material disposed on a first exterior surface of each said body facing the substrate, the component trace electrically insulated from the first and second contact;
    each of the plurality of components respectively containing a network consisting of at least two capacitors connected in series between the first and second contact; and
    a test point formed of conductive material disposed on a second exterior surface of each said body, the test point electrically isolated from the first and second contacts and electrically connected to at least the component trace;
    wherein the component trace is electrically isolated from all of the circuit traces disposed on said circuit substrate when the electronic circuit is free of any fault.

8. A method for fault detection in an electronic circuit, comprising:
- providing a plurality of surface mount device (SMD) components, each said SMD component including a body in which first and second capacitors are internally disposed so as to be connected in series between first and second electrical contacts of the SMD component, each capacitor of the first and second capacitors comprising two parallel capacitive plates, a first one of the two parallel capacitive plates connected to a terminal and a second one of the two parallel plates directly electrically connected to a capacitive plate of the other capacitor of the first and second capacitors at an intermediary node, the first and second electrical contacts formed of a conductive material disposed on at least one exterior surface of the SMD component's body;
- providing on the at least one exterior surface of each of said SMD components a component trace formed of a conductive material and electrically insulated from the first and second electrical contacts;
- providing a test point formed of conductive material on the at least one exterior surface of each of the SMD components electrically connected to the component trace and the intermediary node;
- providing a printed wiring board (PWB) substrate with a plurality of circuit traces formed of conductive material disposed on a surface thereof to define a plurality of attachment sites, each including at least first and second conductive pads;
- forming the electronic circuit by positioning one of the SMD components at each of the plurality of attachment sites and performing soldering operations at each attachment site to electrically connect at least the first and second electrical contacts to the first and second conductive pads; and
- testing the electronic circuit to determine at least one fault by measuring an impedance or a resistance as between the test point and at least one of the electrical contacts.

9. The method according to claim 8, selecting the second exterior surface to be opposed from the first exterior surface.

10. The method according to claim 8, further comprising electrically connecting the first pad at each attachment site to one of the circuit traces that comprises a primary power bus for said electronic circuit, and electrically connecting the second pad to one of the circuit traces that comprises a ground conductor.

11. The method according to claim 8, further comprising including a second plurality of attachment sites on said PWB substrate at which are disposed respectively a second plurality of SMD components, including electronic components other than capacitors.

12. The method according to claim 9, further comprising
- determining whether the soldering operation has created an electrical short circuit connection directly between the first and second pads at any of the attachment sites; and
- identifying one or more of the plurality of attachment sites where the short circuit has occurred by measuring an impedance or resistance as between the test point on an SMD component and at least one of the first and second contact of the SMD component on which the test point is disposed.

13. The method according to claim 8, further comprising testing for the positioning and connection of each said SMD component in the electronic circuit, by measuring an impedance or resistance between the test point and at least one of first and second pads.

14. A method for fault detection in an electronic circuit, comprising:
- providing a plurality of surface mount device (SMD) components, each including a first and second capacitor connected in series between the first and second electrical contacts of the SMD component;
- providing on an exterior surface of each of said SMD components a component trace formed of conductive material and electrically insulated from the first and second electrical contacts;
- providing a test point formed of conductive material on the exterior surface of each of the SMD components electrically connected to the component trace;
- providing a printed wiring board (PWB) substrate with a plurality of circuit traces formed of conductive material disposed on a surface thereof to define a plurality of attachment sites, each including at least first and second conductive pads;
- forming the electronic circuit by positioning one of the SMD components at each of the plurality of attachment sites and performing soldering operations at each attachment site to electrically connect at least the first and second electrical contacts to the first and second conductive pads;
- testing the electronic circuit to determine at least one fault by measuring an impedance or a resistance as between the test point and at least one of the electrical contacts; and
- arranging said component trace and the circuit traces so that the component trace is electrically isolated from all of the circuit traces disposed on said circuit substrate when the electronic circuit is free of any fault.

15. A fault detection optimized electronic circuit, comprising:
- a circuit substrate on which are disposed a plurality of circuit traces formed of conductive material, the circuit substrate including a plurality of attachment sites, each including at least a first and second pad formed of conductive material;
- a plurality of components of the electronic circuit which are respectively disposed at the plurality of attachment sites, each said component comprising a surface mount device (SMD) having a body which includes at least a first and second contact formed of a conductive material disposed on at least a first exterior of the SMD's body facing the substrate, wherein said first contact is electrically connected to the first pad, and the second contact is electrically connected to the second pad;
- a component trace formed of a conductive material disposed on the first exterior surface so as to be electrically insulated from the first and second contacts;
- wherein each of the plurality of components which are positioned at the plurality of attachment sites respectively contain a network consisting of at least two capacitors connected in series between the first and second contacts, each capacitor of the at least two capacitors comprising two parallel capacitive plates disposed internal to the SMD's body, a first one of the two parallel plates directly electrically connected to a capacitive plate of the other capacitor of the at least two capacitors at an intermediary node; and
- a test point formed of conductive material disposed on a second exterior surface of the SMD's body, the test point electrically isolated from the first and second contacts and electrically connected to the component trace and the intermediary node.

16. The fault detection optimized electronic circuit according to claim 15, wherein the second exterior surface is opposed from the first exterior surface.

17. The fault detection optimized electronic circuit according to claim 15, wherein said component trace is elongated and extends across the first exterior surface of each body in a direction transverse to an axis extending between the first and second contacts.

18. A surface mount device (SMD) component, comprising:
- a device body which includes (a) at least first and second contacts formed of a conductive material disposed on at least a first exterior surface at opposing ends thereof and (b) two capacitors internally disposed so as to be connected in series;
- the first contact electrically connected to a first conductive plate of a first capacitor of the two capacitors disposed within the device body, and the second contact electrically connected to a first conductive plate of a second capacitor of the two capacitors disposed within the device body;
- an electrical connection within the device body between the second conductive plate of the first capacitor and the second conductive plate of the second capacitor to define an intermediary node;
- a component trace formed of a conductive material disposed on the first exterior surface of said device body so as to be electrically insulated from the first and second contacts; and
- a test point formed of a conductive material disposed on a second exterior surface of the device body opposed from the first exterior surface, the test point electrically connected to the intermediary node and the component trace.

* * * * *